(12) United States Patent  
Feng et al.

(10) Patent No.: US 9,577,040 B2  
(45) Date of Patent: Feb. 21, 2017

(54) FINFET CONFORMAL JUNCTION AND HIGH EPI SURFACE DOPANT CONCENTRATION METHOD AND DEVICE

(71) Applicant: GLOBALFOUNDRIES Inc., Grand Cayman (KY)

(72) Inventors: Peijie Feng, Clifton Park, NY (US); Jianwei Peng, Ballston Lake, NY (US); Yanxiang Liu, Glenville, NY (US); Shesh Mani Pandey, Clifton Park, NY (US); Francis Benistant, Singapore (SG)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/189,079

(22) Filed: Jun. 22, 2016

(65) Prior Publication Data

US 2016/0308005 A1    Oct. 20, 2016

Related U.S. Application Data

(62) Division of application No. 14/676,912, filed on Apr. 2, 2015, now Pat. No. 9,406,752.

(Continued)

(51) Int. Cl.  
*H01L 29/78* (2006.01)  
*H01L 29/08* (2006.01)  
*H01L 29/66* (2006.01)  
*H01L 21/265* (2006.01)  
*H01L 21/8234* (2006.01)  
*H01L 21/268* (2006.01)  
*H01L 29/10* (2006.01)  
*H01L 29/161* (2006.01)  
*H01L 29/167* (2006.01)  
*H01L 29/417* (2006.01)  
*H01L 21/324* (2006.01)  
*H01L 29/165* (2006.01)

(52) U.S. Cl.  
CPC ......... *H01L 29/0847* (2013.01); *H01L 21/268* (2013.01); *H01L 21/26513* (2013.01); *H01L 21/26586* (2013.01); *H01L 21/823418* (2013.01); *H01L 21/823431* (2013.01); *H01L 29/105* (2013.01); *H01L 29/161* (2013.01); *H01L 29/167* (2013.01); *H01L 29/41725* (2013.01); *H01L 29/66795* (2013.01);  
(Continued)

(58) Field of Classification Search  
CPC .......... H01L 29/7848; H01L 29/66636; H01L 29/785; H01L 29/66795; H01L 29/1608; H01L 29/7851; H01L 21/324; H01L 21/28512; H01L 21/26586; H01L 21/823431  
USPC ....................................................... 257/288  
See application file for complete search history.

(56) References Cited

U.S. PATENT DOCUMENTS

9,093,478 B1    7/2015 Cheng et al.  
9,123,744 B1    9/2015 Liao et al.  
(Continued)

*Primary Examiner* — Nathan W Ha  
(74) *Attorney, Agent, or Firm* — Ditthavong & Steiner, P.C.

(57) ABSTRACT

A method of forming a source/drain region with an abrupt, vertical and conformal junction and the resulting device are disclosed. Embodiments include forming a gate electrode over and perpendicular to a semiconductor fin; forming first spacers on opposite sides of the gate electrode; forming second spacers on opposite sides of the fin; forming a cavity in the fin adjacent the first spacers, between the second spacers; partially epitaxially growing source/drain regions in each cavity; implanting a first dopant into the partially grown source/drain regions with an optional RTA thereafter; epitaxially growing a remainder of the source/drain regions in the cavities, in situ doped with a second dopant; and implanting a third dopant in the source/drain regions.

20 Claims, 8 Drawing Sheets

Related U.S. Application Data (60) Provisional application No. 62/097,466, filed on Dec. 29, 2014.

(52) U.S. Cl.
CPC ........ *H01L 29/785* (2013.01); *H01L 29/7851* (2013.01); *H01L 21/324* (2013.01); *H01L 29/165* (2013.01)

(56) References Cited

U.S. PATENT DOCUMENTS

| | | | |
|---|---|---|---|
| 2008/0099834 A1* | 5/2008 | Willer | H01L 21/823431 257/330 |
| 2009/0008716 A1* | 1/2009 | Goto | H01L 21/823412 257/365 |
| 2010/0148217 A1 | 6/2010 | Simonelli et al. | |
| 2011/0073952 A1* | 3/2011 | Kwok | H01L 29/045 257/368 |
| 2012/0091538 A1 | 4/2012 | Lin et al. | |
| 2013/0154029 A1* | 6/2013 | Cai | H01L 29/66795 257/402 |
| 2013/0175624 A1* | 7/2013 | Chang | H01L 29/785 257/347 |
| 2013/0187228 A1 | 7/2013 | Xie et al. | |
| 2014/0048857 A1 | 2/2014 | Cheng et al. | |
| 2014/0110784 A1 | 4/2014 | Jagannathan et al. | |
| 2014/0346600 A1 | 11/2014 | Cheng et al. | |
| 2014/0361336 A1 | 12/2014 | Chen et al. | |
| 2015/0236016 A1 | 8/2015 | Wann et al. | |
| 2015/0333171 A1 | 11/2015 | Hsu | |
| 2015/0340497 A1 | 11/2015 | Xie et al. | |

\* cited by examiner

FINFET CONFORMAL JUNCTION AND HIGH EPI SURFACE DOPANT CONCENTRATION METHOD AND DEVICE

RELATED APPLICATIONS

The present application is a Divisional of application Ser. No. 14/676,912, filed on Apr. 2, 2015, which claims priority to U.S. Provisional Application 62/097,466, filed Dec. 29, 2014, the disclosures of which are incorporated herein by reference in their entirety.

TECHNICAL FIELD

The present disclosure relates to fabrication of fin-type field effect transistors (FinFETs) with epitaxially grown source/drain regions. The present disclosure is particularly applicable to devices for the 14 nanometer (nm) technology node and beyond.

BACKGROUND

In current processes of forming cavities for epitaxial growth of source/drain regions, non-vertical cavity sidewalls are formed, and conventional source/drain implantations result in non-uniform doping profiles. Consequently, a non-conformal junction is formed which in turn leads to threshold voltage non-uniformity along the fin height. During the device operation, the non-conformal junction will prevent the fin active region from full utilization, and it also degrades channel resistance and spreading resistance. Besides, the junction invasion at the fin tip worsens short channel effects.

Figure 1A:
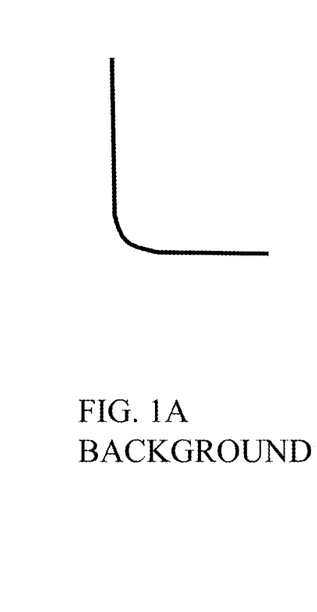
FIG. 1A schematically illustrates a desired cavity sidewall.
Figure 1B:
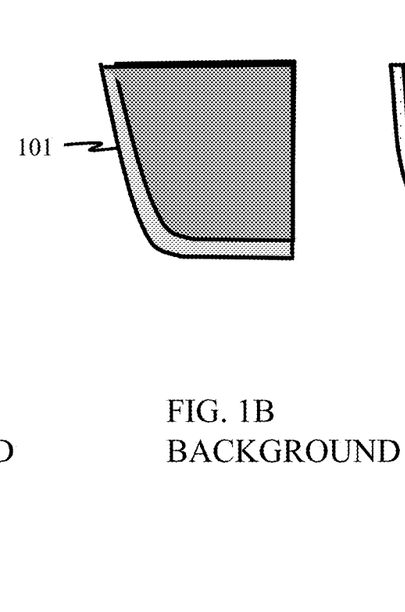
FIG. 1B schematically illustrates an implant profile after source/drain implantation.
Figure 1C:
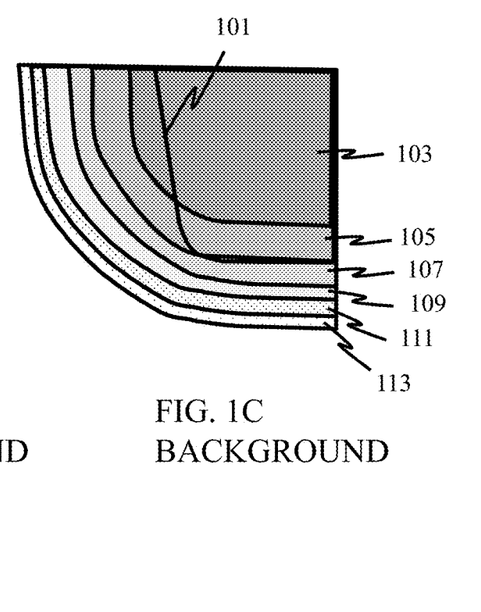
FIG. 1C schematically illustrates an implant profile after all thermal processes.
Figure 2A:
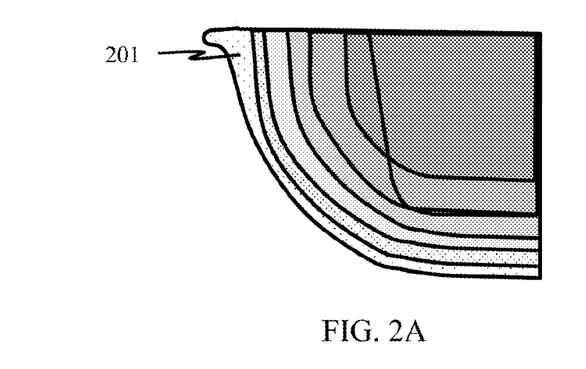
FIGS. 2A through 2C schematically illustrate implant profiles after conventional low energy, moderate energy, and high energy implantations, respectively.
Figure 2B:
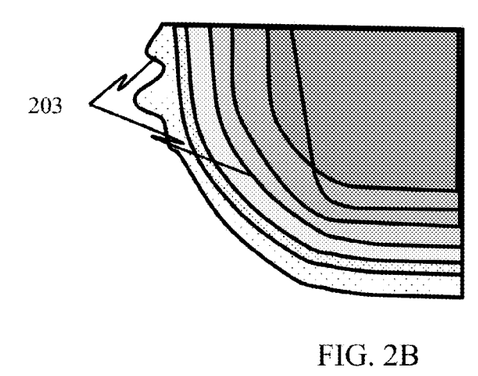
Figure 2C:
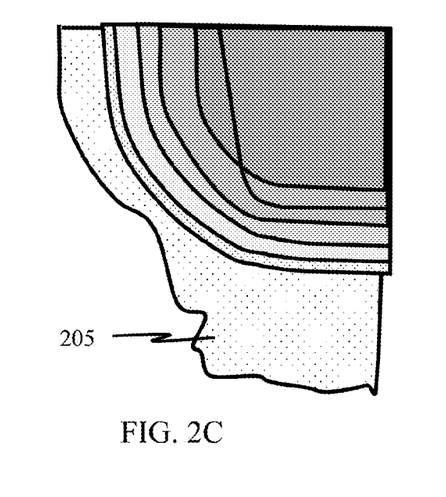

FIG. 1A illustrates a desired cavity sidewall. FIG. 1B illustrates an implant profile after source/drain implantation, which includes a sloped sidewall (at 101). Adverting to FIG. 1C, after all thermal processes, the resulting dopant profile forms a gradient with a decreasing concentration from 103 to 113. As illustrated in FIG. 2A, conventional low energy and heavy dose source/drain implantation after epitaxial growth aimed for ohmic contact will introduce excessive dopant at the fin tip region 201. If a moderate energy source/drain implantation is employed, the middle to bottom effective gate length Leff is slightly reduced, but the junction over all is degraded at regions 203 in FIG. 2B and the junction profile is not straightened. A high energy implantation will cause serious tailing, as illustrated at 205 in FIG. 2C.

Figure 3A:
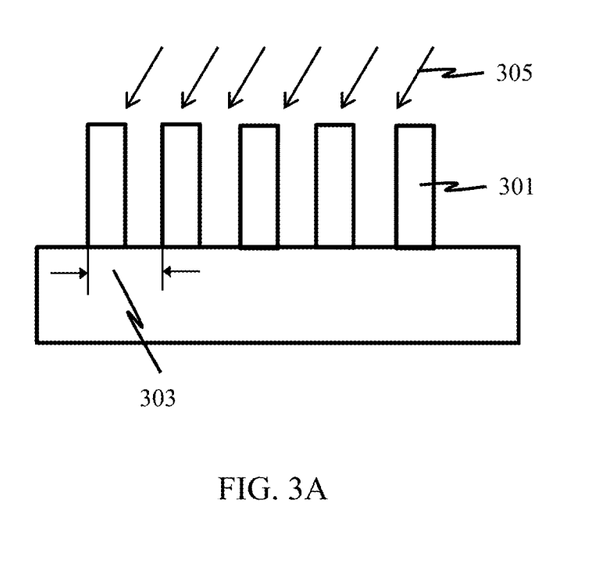
FIG. 3A schematically illustrates a tilted extension implantation for a FinFET with multiple fins.
Figure 3B:
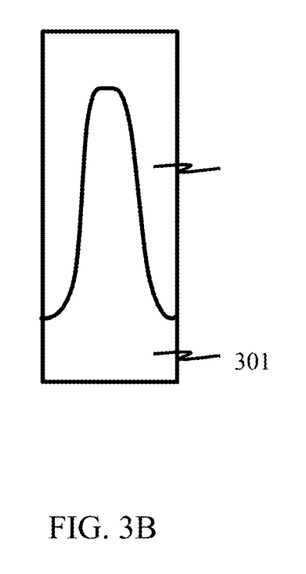
FIG. 3B schematically illustrates the implant profile resulting from the implantation shown in FIG. 3A.
Figure 4A:
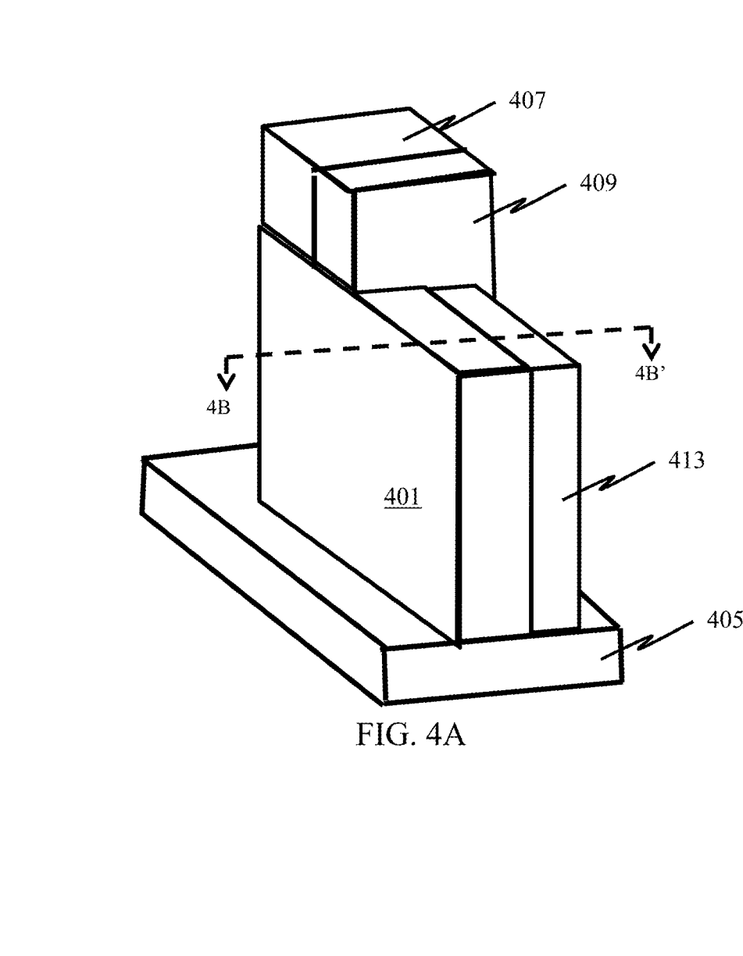
Figure 4B:
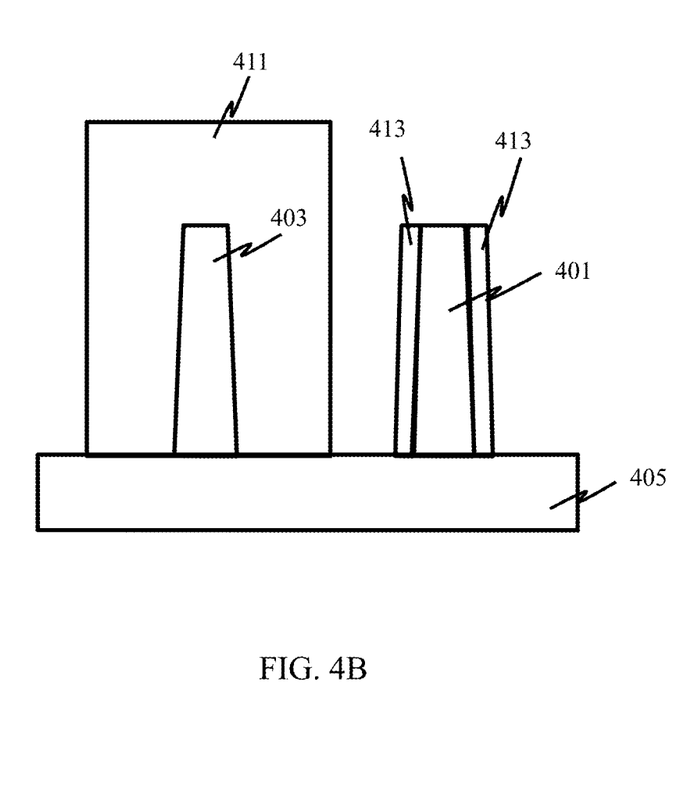

The conventional extension implantation techniques cannot straighten the junction. As illustrated in FIG. 3A, for FinFETs with fins 301 having a pitch 303 between 20 and 40 nm, extension implantation 305 is tilted with respect to the fins 301 to cover the entire fin sidewall. However, as illustrated in FIG. 3B, the resultant implantation 307 is non-conformal and non-uniform, and it will also cause both causes fin damage and junction uniformity issues. Thus, conventional implantation before or right after source/drain epitaxial growth will cause a graded junction, undesired junction tailing, a non-conformal junction, and fin damage.

A need therefore exists for methodology enabling formation of both a conformal junction and a high epi surface dopant concentration in a FinFET and the resulting device.

SUMMARY

An aspect of the present disclosure is a method of forming a source/drain region including partially epitaxially growing the source/drain region, doping the partially grown source/drain region, and epitaxially growing the remainder of the source/drain region with in situ doping, and doping the remainder of the region.

Another aspect of the present disclosure is a FinFET device having abrupt, vertical and conformal junction.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a gate electrode over and perpendicular to a semiconductor fin; forming first spacers on opposite sides of the gate electrode; forming second spacers on opposite sides of the fin; forming a cavity in the fin adjacent the first spacers, between the second spacers; partially epitaxially growing source/drain regions in each cavity; implanting a first dopant into the partially grown source/drain regions; epitaxially growing a remainder of the source/drain regions in the cavities, in situ doped with a second dopant; and implanting a third dopant in the source/drain regions.

Aspects of the present disclosure include implementing a rapid thermal anneal (RTA) between implanting the first dopant and implanting the third dopant. Other aspects include partially epitaxially growing the source/drain regions includes growing the source/drain regions to a height of 0 to 80% of the depth of the cavity. Further aspects include implanting the first dopant with a dose of $1e14$ $cm^{-3}$ to $1e16$ $cm^{-3}$ and at an energy of 1 kiloelectron Volt (keV) to 10 keV. Another aspect includes implementing the RTA at a high temperature greater than 800° C. to repair fin damage, activate implanted dopants, and drive the dopants diffusing into the fin bottom region. Other aspects include in situ doping the second dopant with a concentration of $1e19$ $cm^{-3}$ to $1e21$ $cm^{-3}$. Additional aspects include implanting the third dopant with a concentration of $1e14$ $cm^{-3}$ to $1e16$ $cm^{-3}$ and at an energy of 0.5 keV to 2 keV. Another aspect includes implanting the first dopant in a direction perpendicular to a top surface of the partially epitaxially grown source/drain regions. Additional aspects include implanting the third dopant with zero degrees of rotation and with a maximum tilt with respect to the fin.

Another aspect of the present disclosure is a device including: a gate electrode over and perpendicular to a semiconductor fin; first spacers on opposite sides of the gate electrode; second spacers on opposite sides of the fin; an epitaxially grown source/drain region in the fin adjacent the first spacers, between the second spacers, the epitaxially grown source/drain region having a bottom portion and a top portion; a first dopant implanted in the bottom portion; a second dopant in situ doped in the top portion; and a third dopant implanted in the top portion, wherein the source/drain region has an abrupt, vertical and conformal junction boundary.

Aspects include the bottom portion having a height of 0 to 80% of the height of the eptiaxially grown source/drain region. Other aspects include the first dopant having a dose of $1e14$ $cm^{-3}$ to $1e16$ $cm^{-3}$ and being implanted at an energy of 1 kiloelectron Volt (keV) to 10 keV. Further aspects include the second dopant having a concentration of $1e19$ $cm^{-3}$ to $1e21$ $cm^{-3}$. Additional aspects include the third dopant having a concentration of $1e14$ $cm^{-3}$ to $1e16$ $cm^{-3}$ and being implanted at an energy of 0.5 keV to 2 keV.

Another aspect includes the epitaxially grown source/drain region including eSiGe and the first, second, and third dopants including $BF_2$. Further aspects include the epitaxially grown source/drain regions including SiP and the first, second, and third dopants including arsenic.

Another aspect of the present disclosure is a method including forming first and second parallel semiconductor fins on a substrate; forming a gate electrode over and perpendicular to the first and second semiconductor fins; forming first spacers on opposite sides of the gate electrode; forming a first mask over the first fin; forming second spacers on opposite sides of the second fin; forming a first cavity in the second fin adjacent each first spacer, between the second spacers; partially epitaxially growing eSiGe source/drain regions to a height of 0 to 80% of the depth of the first cavity in each first cavity; implanting a first $BF_2$ into the partially grown eSiGe; epitaxially growing eSiGe for a remainder of the source/drain regions in the first cavities, in situ doped with a second $BF_2$; removing the mask; forming a second mask over the second fin; forming third spacers on opposite sides of the first fin; forming a second cavity in the first fin adjacent each first spacer, between the third spacers; partially epitaxially growing SiP source/drain regions to a height of 0 to 80% of the depth of the second cavity in each second cavity; implanting a first arsenic into the partially grown SiP; epitaxially growing SiP for a remainder of the source/drain regions in the second cavities, in situ doped with a second arsenic; removing the second mask; implanting a third $BF_2$ in the eSiGe source/drain regions; and implanting a third arsenic in the SiP source/drain regions.

Aspects include implementing a rapid thermal anneal (RTA) subsequent to implanting the first $BF_2$ and/or subsequent to implanting the first arsenic, the RTA having a peak temperature higher than 800° C. and for a duration longer than 1 second. Other aspects include implanting the first arsenic and the first $BF_2$ with a dose of $1e14$ $cm^{-3}$ to $1e16$ $cm^{-3}$, at an energy of 1 keV to 10 keV, and in a direction perpendicular to a top surface of the partially epitaxially grown source/drain regions. Further aspects include in situ doping the second arsenic and the second $BF_2$ with a concentration of $1e19$ $cm^{-3}$ to $1e21$ $cm^{-3}$. Other aspects include implanting the third arsenic and the third $BF_2$ with a concentration of $1e14$ $cm^{-3}$ to $1e16$ $cm^{-3}$, at an energy of 0.5 keV to 2 keV and at maximum tilt angle with respect to a plane perpendicular to the first and second fins and with zero rotation.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 4A through 7A and FIGS. 4B through 7B and 8 schematically illustrate a three-dimensional view and a cross-sectional view, along the length of a fin and across the fin, of a process flow, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of graded junctions, undesired junction tailing, non-conformal junctions, and fin damage attendant upon performing source/drain implantation right after source/drain epitaxial growth. In accordance with embodiments of the present disclosure, source/drain regions are partially epitaxially grown followed by a high dose, low energy implantation to straighten the junction at the middle-to-bottom region. An optional RTA can be implemented to repair the damage and further drive the dopant into the fin middle-to-bottom region. Next, the remainder of the source/drain region is epitaxially grown with a low concentration of in situ dopant to prevent aggressive dopant diffusion at the fin tip. Last, a high dose, low energy source/drain implantation is performed for ohmic contact.

Methodology in accordance with embodiments of the present disclosure includes forming a gate electrode over and perpendicular to a semiconductor fin and forming first spacers on opposite sides of the gate electrode. Then second spacers are formed on opposite sides of the fin, and a cavity is formed in the fin adjacent the first spacers, between the second spacers. Source/drain regions are partially epitaxially grown in each cavity, and a first dopant is implanted into the partially grown source/drain regions with an optional RTA thereafter. A remainder of the source/drain regions is epitaxially grown in the cavities and is in situ doped with a second dopant. Last, a third dopant is implanted in the source/drain regions.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects.

Accordingly, the drawings and description are to be regarded as illustrative in nature, and not as restrictive.

FIGS. 4A through 7A and FIGS. 4B through 7B and 8 schematically illustrate a three-dimensional view and a cross-sectional view, along the length of a fin and across the fin, respectively, of a process flow, in accordance with an exemplary embodiment. Adverting to FIGS. 4A and 4B, silicon fins 401 and 403 are shown on a substrate 405. A gate electrode 407 is formed over and perpendicular to fin 401, with gate sidewall spacers 409 on opposite sides of the gate electrode. The gate electrode and gate sidewall spacers are also formed over and perpendicular to fin 403, but is not shown for illustrative convenience. FIN 403, for example for a PFET, is covered with a mask 411 during processing of fin 401, which is, for example, for an NFET. Once fin 403 is masked off, spacers 413 are formed on opposite sides of fin 401.

Figure 5A:
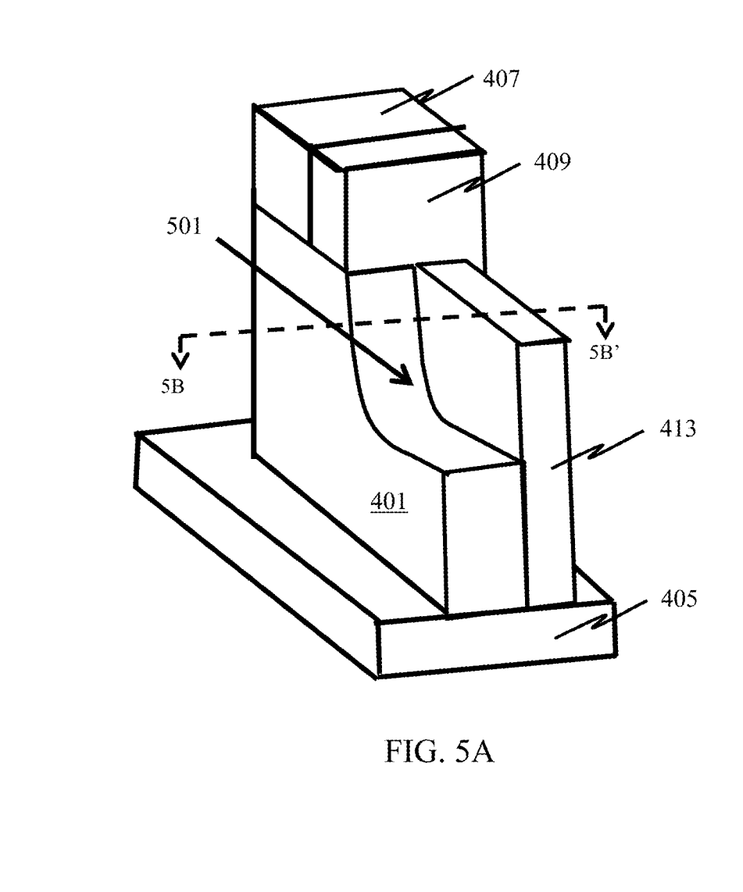
Figure 5B:
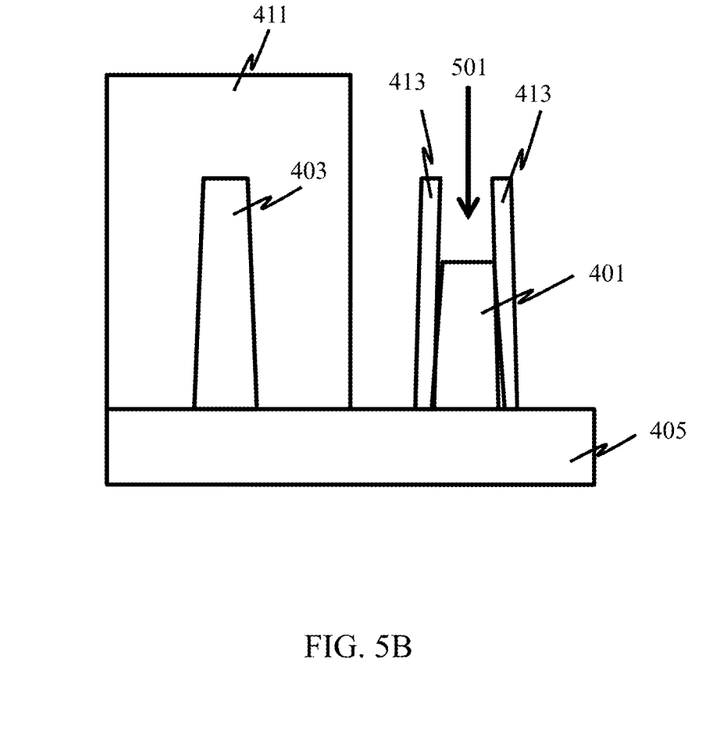

As illustrated in FIGS. 5A and 5B, a cavity 501 is etched in fin 401, between spacers 413 for a source/drain region. A corresponding cavity is formed on the opposite side of the gate electrode, but is not shown for illustrative convenience. The cavity is formed to a depth of 80% to 125% of the fin height.

Figure 6A:
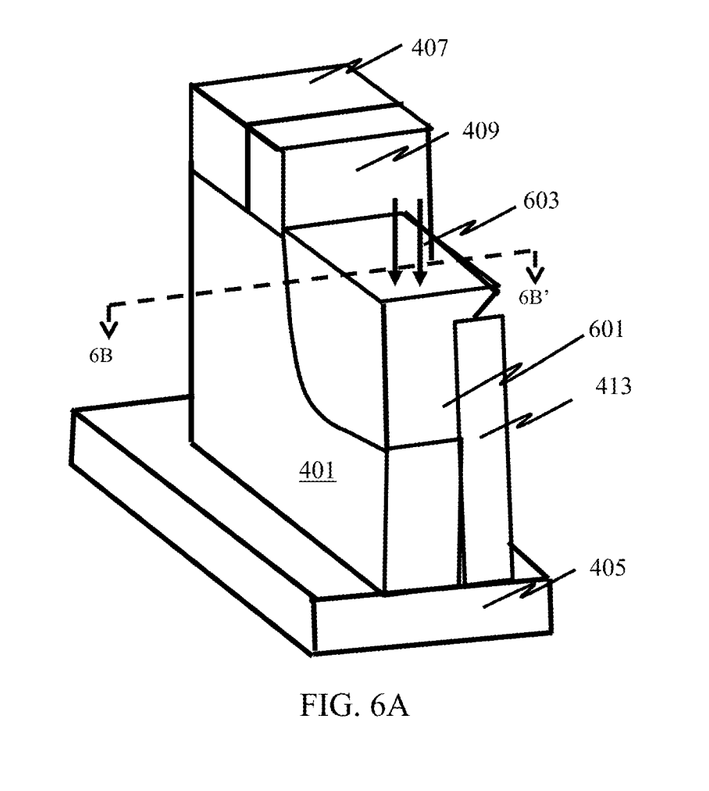
Figure 6B:
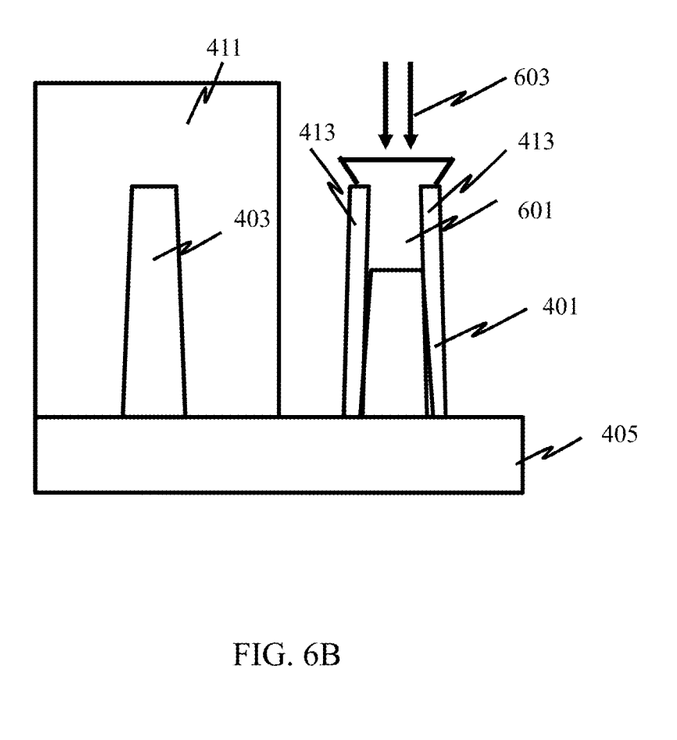

Next, silicon phosphide (SiP) 601 is partially grown in the cavities to a height of 0 to 80% of the depth of the cavities 501, for example 50%. Arsenic 603 is implanted in SiP 601 with a low energy and a high dose, with zero tilt, to straighten the junction at the middle-to-bottom region. For example, arsenic may be implanted at an energy of 1 kiloelectron volt (keV) to 10 keV and a dose of 1e14 $cm^{-3}$ to 1e16 $cm^{-3}$, though "low energy" depends on the thickness of the SiP. An optional RTA can be implemented to further drive the implanted dopant into the fin lower part region. The RTA may have a peak temperature higher than 800° C. and last for a duration longer than 1 second. Then the upper surface of SiP is surface cleaned.

Figure 7A:
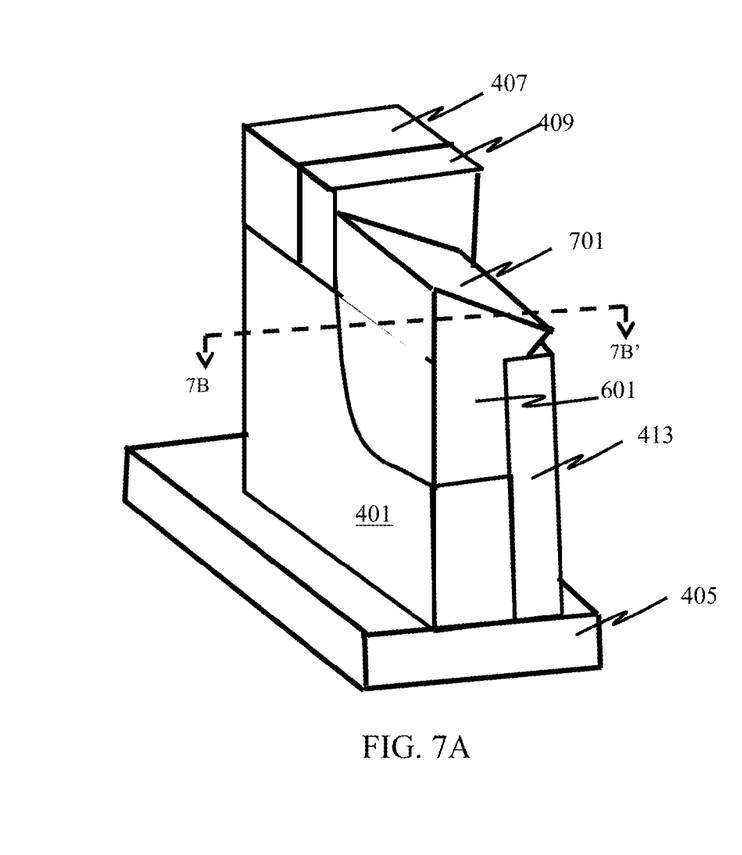
Figure 7B:
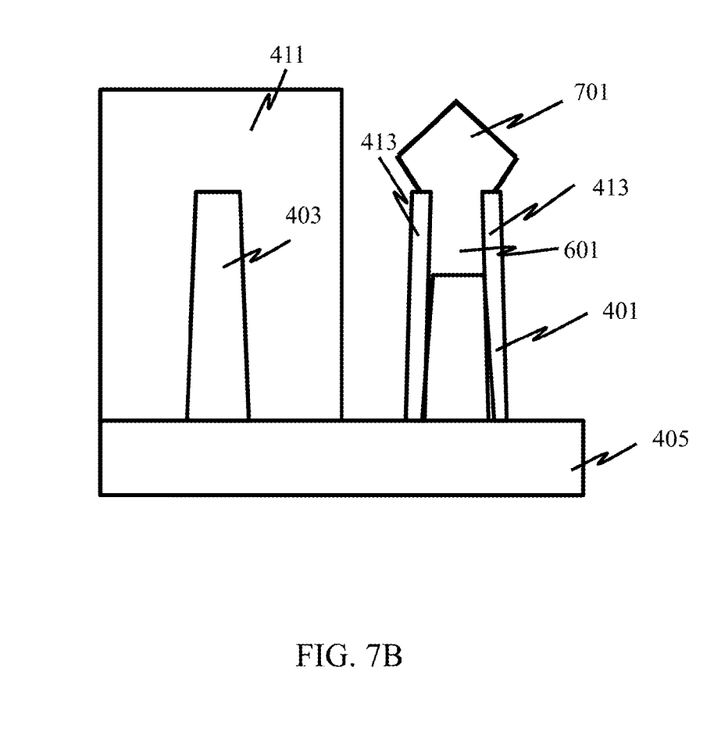
Figure 8:
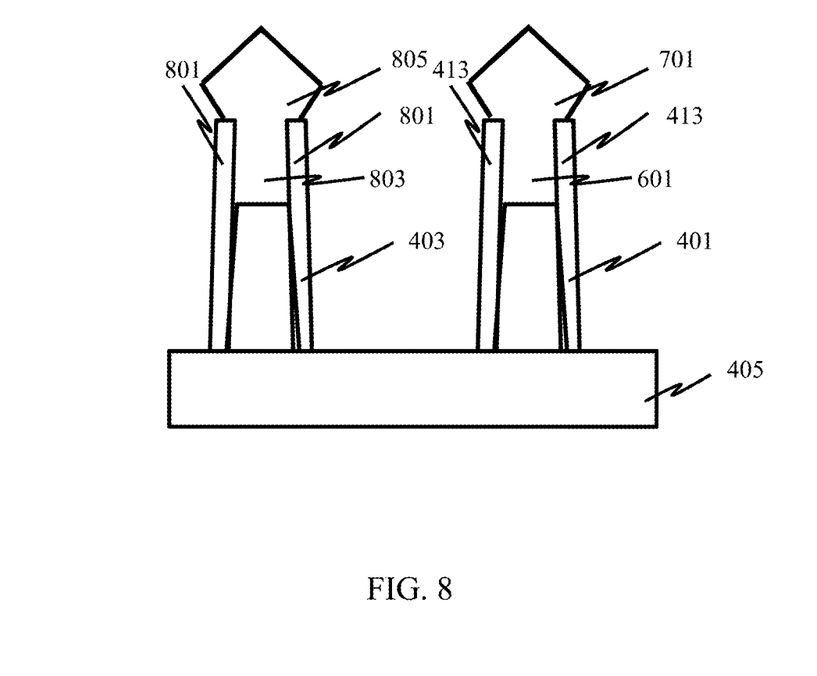

Adverting to FIGS. 7A and 7B, SiP 701 is grown in the remainder of the cavity, with in situ doping having a lighter concentration than arsenic 603. For example, arsenic is implanted in situ in SiP 701 with a dosage of 1e19 to 1e21 $cm^{-3}$. The light concentration of dopant prevents aggressive dopant diffusion at the fin tip region.

Next, mask 411 is removed and a new mask (not shown for illustrative convenience) is formed over fin 401 to protect fin 401 during processing of fin 403. The steps described above for processing of fin 401 are then substantially repeated for fin 403, substituting embedded silicon germanium (eSiGe) for the SiP and born difluoride ($BF_2$) for the dopant. In other words, spacers 803 are formed, and a cavity is etched in fin 403 on each side of the gate electrode to a depth of 80% to 125% of the fin height. eSiGe 803 is then partially grown in the cavity to a height of 0 to 80% of the depth of the cavities, for example 50%. $BF_2$ is implanted in eSiGe 803 with a low energy and a high dose, with zero tilt, e.g. an energy of 1 keV to 10 keV and a dose of 1e14 $cm^{-3}$ to 1e16 $cm^{-3}$. An optional RTA may be implemented to further drive the implanted dopant into the fin lower part region. The RTA may have a peak temperature higher than 800° C. and last for a duration longer than 1 second. The epitaxial surface is surface cleaned and eSiGe 805 is grown in the remainder of the cavity, in situ doped with $BF_2$ with a lighter concentration, for example with a dosage of 1e19 to 1e21 $cm^{-3}$, resulting in the structure shown in FIG. 8.

After both the NFET and PFET source/drain regions are both epitaxially grown, each is implanted with a dopant with a high dose, for example 1e14 $cm^{-3}$ to 1e16 $cm^{-3}$, and low energy, for example 0.5 keV to 2 keV, e.g. 1 keV, for ohmic contact. The dopant for the NFET is arsenic and for the PFET is $BF_2$. The last high dose source/drain implantation is performed across the fin, at an angle of 0 to 25° with respect to a surface perpendicular to the fin. An RTA and a laser spike anneal (LSA) then drive the dopants into the source/drain regions.

The embodiments of the present disclosure can achieve several technical effects, such as an improved junction without an extra mask, reduced effective gate length in the mid-to-bottom region of the source/drain region without implantation tailing, reduced dopant diffusion at the fin tip region, reduced dopant in the channel, and a conformal junction. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated FinFET semiconductor devices, particularly for the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
a gate electrode over and perpendicular to a semiconductor fin;
first spacers on opposite sides of the gate electrode;
second spacers on opposite sides of the fin;
an epitaxially grown source/drain region in the fin adjacent the first spacers, between the second spacers, the epitaxially grown source/drain region having a bottom portion and a top portion;
a first dopant implanted in the bottom portion;
a second dopant in situ doped in the top portion; and
a third dopant implanted in the top portion, wherein the source/drain region has an abrupt, vertical and conformal junction boundary.

2. The device according to claim 1, wherein the bottom portion has a height of 0 to 80% of the height of the epitaxially grown source/drain region.

3. The device according to claim 1, wherein the first dopant has a dose of 1e14 $cm^{-3}$ to 1e16 $cm^{-3}$ and is implanted at an energy of 1 kiloelectron Volt (keV) to 10 keV.

4. The device according to claim 1, wherein the second dopant has a concentration of 1e19 $cm^{-3}$ to 1e21 $cm^{-3}$.

5. The device according to claim 1, wherein the third dopant has a concentration of 1e14 $cm^{-3}$ to 1e16 $cm^{-3}$ and is implanted at an energy of 0.5 keV to 2 keV.

6. The device according to claim 1, wherein the epitaxially grown source/drain region comprises embedded silicon germanium (eSiGe).

7. The device according to claim 6, wherein the first, second, and third dopants comprise boron difluoride ($BF_2$).

8. The device according to claim 1, wherein the epitaxially grown source/drain regions comprise silicon phosphide (SiP).

9. The device according to claim 8, wherein the first, second, and third dopants comprise arsenic.

10. A device comprising:
   a gate electrode over a semiconductor fin;
   first spacers on opposite sides of the gate electrode;
   second spacers on opposite sides of the fin;
   a source/drain region in the fin adjacent the first spacers, between the second spacers, the source/drain region having a bottom portion and a top portion;
   a first dopant in the bottom portion;
   a second dopant in the top portion; and
   a third dopant in the top portion, wherein the source/drain region has an abrupt, vertical and conformal junction boundary.

11. The device according to claim 10, wherein the bottom portion has a height of 0 to 80% of the height of the epitaxially grown source/drain region.

12. The device according to claim 10, wherein the first dopant has a dose of 1e14 $cm^{-3}$ to 1e16 $cm^{-3}$ and is implanted at an energy of 1 kiloelectron Volt (keV) to 10 keV.

13. The device according to claim 10, wherein the second dopant has a concentration of 1e19 $cm^{-3}$ to 1e21 $cm^{-3}$.

14. The device according to claim 10, wherein the third dopant has a concentration of 1e14 $cm^{-3}$ to 1e16 $cm^{-3}$ and is implanted at an energy of 0.5 keV to 2 keV.

15. The device according to claim 10, wherein the source/drain region comprises embedded silicon germanium (eSiGe).

16. The device according to claim 15, wherein the source/drain region is epitaxially grown.

17. The device according to claim 16, wherein the first, second, and third dopants comprise boron difluoride ($BF_2$).

18. The device according to claim 10, wherein the epitaxially grown source/drain regions comprise silicon phosphide (SiP).

19. The device according to claim 18, wherein the first, second, and third dopants comprise arsenic.

20. A device comprising:
   a gate electrode over and perpendicular to a semiconductor fin;
   first spacers on opposite sides of the gate electrode;
   second spacers on opposite sides of the fin;
   an epitaxially grown source/drain region in the fin adjacent the first spacers, between the second spacers, the epitaxially grown source/drain region having a bottom portion and a top portion;
   a first dopant implanted in the bottom portion, the first dopant implanted with a dose of 1e14 $cm^{-3}$ to 1e16 $cm^{-3}$ and at an energy of 1 kiloelectron Volt (keV) to 10 keV;
   a second dopant in situ doped in the top portion, the second dopant in situ doped with a concentration of 1e19 $cm^{-3}$ to 1e21 $cm^{-3}$; and
   a third dopant implanted in the top portion, the third dopant implanted with a concentration of 1e14 $cm^{-3}$ to 1e16 $cm^{-3}$ and at an energy of 0.5 keV to 2 keV,
   wherein the source/drain region has an abrupt, vertical and conformal junction boundary.

* * * * *